United States Patent
Baratam et al.

(10) Patent No.: US 12,068,745 B2
(45) Date of Patent: Aug. 20, 2024

(54) MULTI-BIT SCAN CHAIN WITH ERROR-BIT GENERATOR

(71) Applicant: Arm Limited, Cambridge (GB)

(72) Inventors: Anil Kumar Baratam, Bangalore (IN); Yves Thomas Laplanche, Valbonne (FR)

(73) Assignee: Arm Limited, Cambridge (GB)

( * ) Notice: Subject to any disclaimer, the term of this patent is extended or adjusted under 35 U.S.C. 154(b) by 402 days.

(21) Appl. No.: 17/462,524

(22) Filed: Aug. 31, 2021

(65) Prior Publication Data

US 2023/0063727 A1 Mar. 2, 2023

(51) Int. Cl.
  *H03K 19/007* (2006.01)
  *H03K 19/096* (2006.01)
  *H03K 19/173* (2006.01)

(52) U.S. Cl.
  CPC ....... *H03K 19/0075* (2013.01); *H03K 19/096* (2013.01); *H03K 19/1737* (2013.01)

(58) Field of Classification Search
  CPC ............. H03K 19/0075; H03K 19/096; H03K 19/1737
  USPC ........................................................ 370/333
  See application file for complete search history.

(56) References Cited

U.S. PATENT DOCUMENTS

| | | | | |
|---|---|---|---|---|
| 6,188,240 B1 * | 2/2001 | Nakaya | ................... | G06F 7/503 708/514 |
| 6,694,464 B1 * | 2/2004 | Quayle | ................ | G06F 30/331 714/736 |
| 8,335,976 B2 * | 12/2012 | Daga | ................. | H03M 13/2927 714/753 |
| 8,461,865 B2 * | 6/2013 | Schlagenhaft | ............................. | G01R 31/318541 326/46 |
| 8,629,548 B1 * | 1/2014 | Andreev | ............ | H03K 19/0016 257/691 |
| 8,775,839 B2 * | 7/2014 | Cousson | ................. | G06F 1/325 713/322 |
| 9,261,561 B2 * | 2/2016 | Maliuk | .......... | G01R 31/318516 |
| 9,366,725 B1 * | 6/2016 | Kapoor | ............ | G01R 31/31721 |
| 9,444,496 B2 * | 9/2016 | Manoochehri | ........ | H03M 13/29 |
| 9,543,016 B1 * | 1/2017 | Jin | ...................... | G11C 16/0483 |
| 9,720,438 B2 * | 8/2017 | Lee | ........................... | G06F 1/10 |
| 9,748,956 B2 * | 8/2017 | Lee | ....................... | G11C 29/028 |
| 10,204,674 B2 * | 2/2019 | Kalla | .................. | G11C 11/4076 |
| 10,587,253 B1 * | 3/2020 | Huang | .................. | H03K 5/135 |
| 10,600,458 B2 * | 3/2020 | Jeon | ................ | G11C 29/50012 |
| 10,727,854 B1 * | 7/2020 | Greshishchev | ..... | H03M 1/0836 |
| 10,771,084 B2 * | 9/2020 | Koli | ...................... | H03K 3/0233 |
| 10,915,471 B2 * | 2/2021 | ChoFleming | ....... | G06F 12/0866 |
| 10,931,329 B2 * | 2/2021 | Shah | ....................... | G06F 13/40 |
| 11,088,682 B2 * | 8/2021 | Lim | ........................ | H03K 5/14 |
| 11,120,724 B2 * | 9/2021 | Kim | ........................ | G09G 3/20 |

(Continued)

*Primary Examiner* — Melvin H Pollack
(74) *Attorney, Agent, or Firm* — Pramudji Law Group PLLC; Ari Pramudji (57) ABSTRACT

Various implementations described herein are directed to a device having a scan chain that receives a multi-bit input, provides a multi-bit output, and provides a multi-bit multiplexer output based on the multi-bit input and the multi-bit output. The device may have an error-bit generator that receives the multi-bit multiplexer output, receives a portion of the multi-bit input, receives a portion of the multi-bit output, and provides an error-bit output based on the multi-bit multiplexer output, the portion of the multi-bit input, and the portion of the multi-bit output.

20 Claims, 4 Drawing Sheets

(56) References Cited

U.S. PATENT DOCUMENTS

| | | | | |
|---|---|---|---|---|
| 11,146,251 | B2* | 10/2021 | DeForge | G06F 30/367 |
| 11,221,929 | B1* | 1/2022 | Katz | G06N 3/04 |
| 11,249,530 | B1* | 2/2022 | Pal | G06F 1/324 |
| 11,296,700 | B1* | 4/2022 | Rao | H03K 3/0372 |
| 11,307,873 | B2* | 4/2022 | Halpern | G06F 9/4494 |
| 11,329,640 | B1* | 5/2022 | Wu | H03K 5/14 |
| 11,356,100 | B2* | 6/2022 | Vrudhula | G06F 30/347 |
| 2013/0002950 | A1* | 1/2013 | Thompson | H04N 21/44004 |
| | | | | 348/E5.009 |
| 2021/0157312 | A1* | 5/2021 | Cella | G01M 13/045 |
| 2021/0382518 | A1* | 12/2021 | Uytterhoeven | H03K 5/135 |
| 2022/0100601 | A1* | 3/2022 | Baum | G06F 11/1608 |
| 2022/0302918 | A1* | 9/2022 | Srivastava | G06F 1/08 |

* cited by examiner

410 — generate a mux-clock based on an external clock
and a scan enable signal

420 — provide scan chain logic to receive a multi-bit input, generate
a multi-bit output, and generate a multi-bit multiplexer output
based on the mux-clock, the external clock,
the multi-bit input and the multi-bit output 430 — generate an error-bit based on the external clock,
the multi-bit multiplexer output, a portion of the multi-bit input,
and a portion of the multi-bit output

FIG. 4

MULTI-BIT SCAN CHAIN WITH ERROR-BIT GENERATOR

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

For safety critical cores, there is a need to flag any soft error that is created due to particle strike on one of the storage nodes. In conventional circuit designs, one of the known techniques refers to generating a parity for a number of bits before and after the clock edge and then compare the parity for detecting data errors. Sometimes, parity bit generation logic requires significant area since it needs extensive error tree logic along with supporting logic circuitry to propagate error to the system level. Also, the parity bit generation logic typically requires an increase in setup time of the error logic, which is often unacceptable since there can be many non-critical timing paths that are used for parity detection of errors. Thus, there exists a need to improve the efficiency of parity integration designs that enhances area and performance targets in modern conventional circuitry.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to multi-bit scan chain architecture with error-bit generation schemes and techniques for supporting parity-bit generation related applications in reference to physical circuit designs. Various applications related to an area optimal multi-bit flip-flop with parity may be used to improve area and performance in logic structures along with related physical circuit designs. Various schemes and techniques that are described herein may also provide for an area optimal circuit design that utilizes a multi-bit flip-flop that incorporates parity-bit generation for error detection.

Various implementations of providing various multi-bit scan chain architecture with an error-bit generator will be described herein with reference to FIGS. 1-4.

Figure 1:
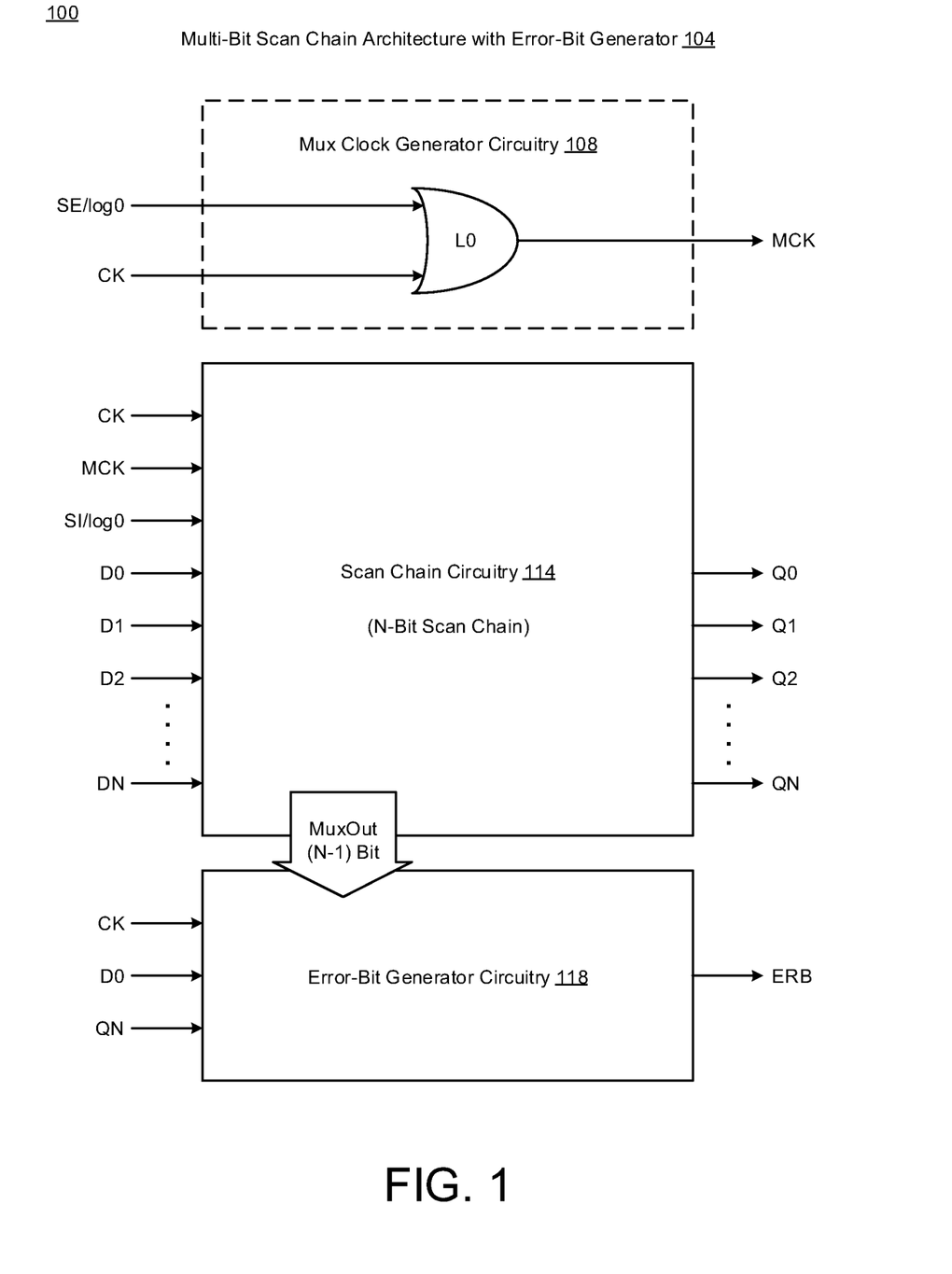
FIGS. 1-3 illustrate various diagrams of multi-bit scan chain architecture with an error-bit generator in accordance with various implementations described herein.
Figure 2:
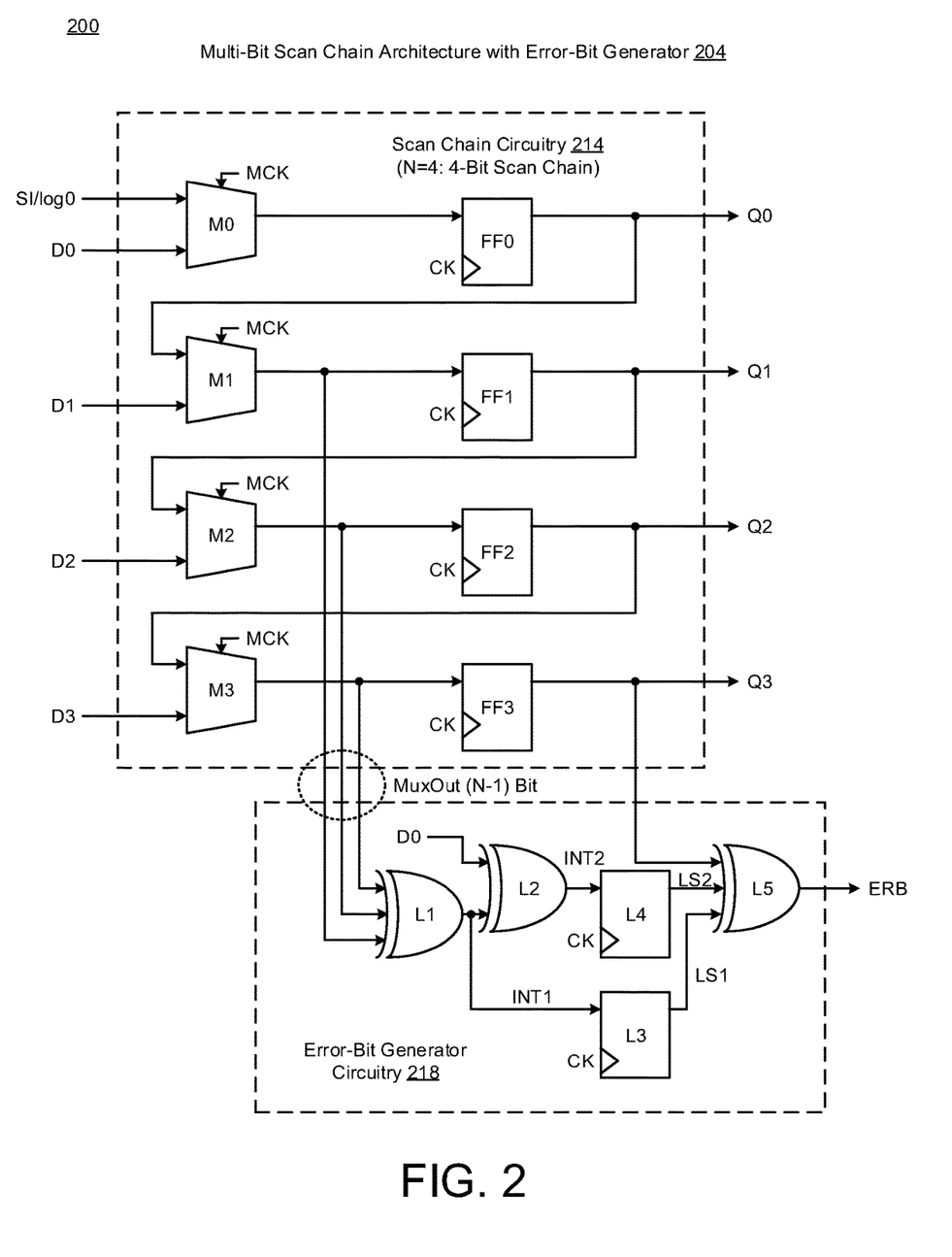
Figure 3:
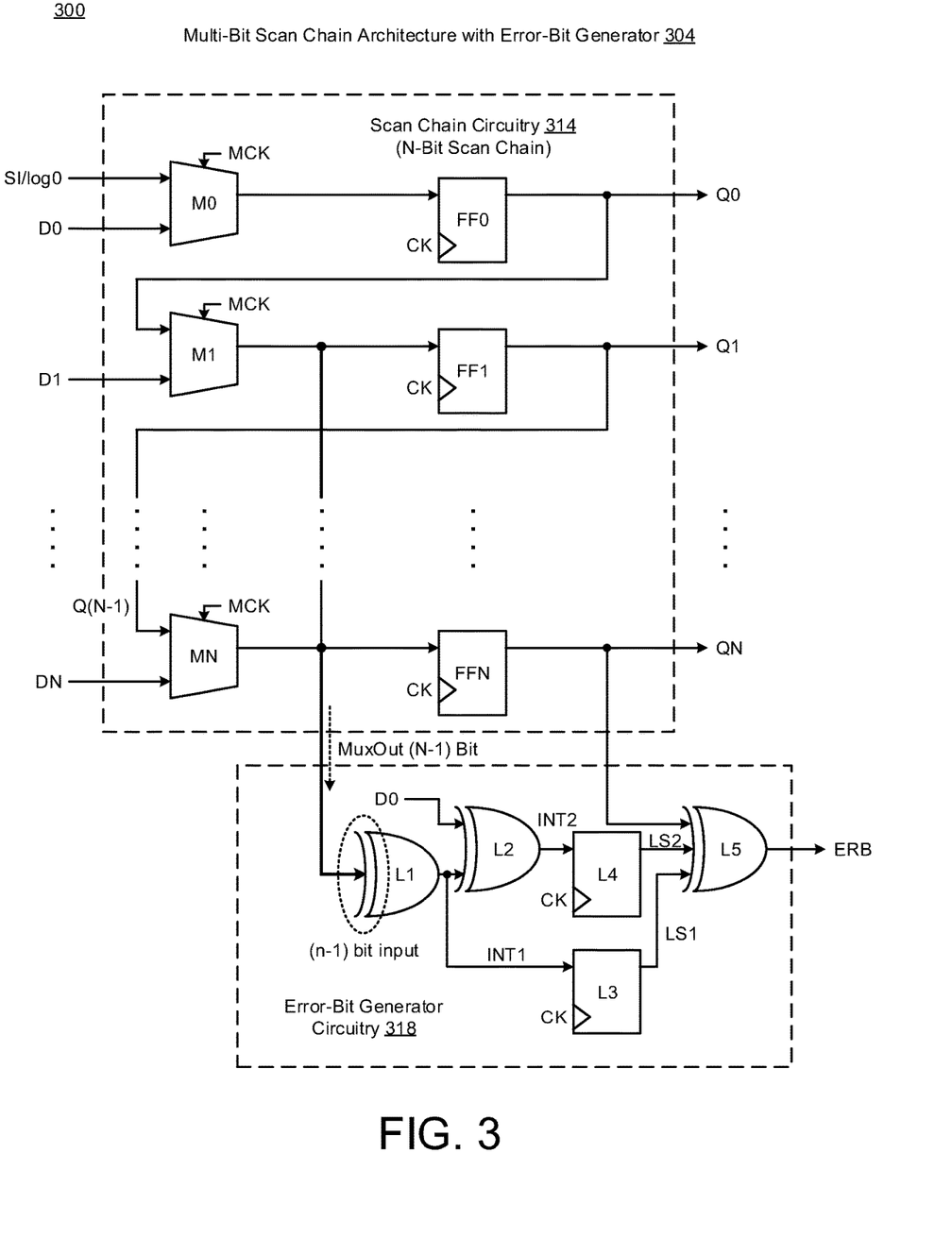

FIGS. 1-3 illustrate diagrams of multi-bit scan chain architecture with an error-bit generator in accordance with various implementations described herein.

In particular, FIG. 1 shows a diagram 100 of multi-bit scan chain architecture 104 with an error-bit generator circuitry 118, FIG. 2 shows a diagram 200 of multi-bit scan chain architecture 204 with an error-bit generator circuitry 218, and FIG. 3 shows a diagram 300 of multi-bit scan chain architecture 304 with an error-bit generator circuitry 318.

In various implementations, multi-bit scan chain architecture may be implemented as a system or a device having various integrated circuit (IC) components that are arranged and coupled together as an assemblage or a combination of parts that provide for physical circuit designs and related structures. In some instances, a method of designing, providing, fabricating and/or manufacturing multi-bit scan chain architecture as an integrated system or device may involve use of various IC circuit components described herein so as to implement various related fabrication schemes and techniques associated therewith. Also, the multi-bit scan chain architecture may be integrated with various computing circuitry and components on a single chip, and further, the multi-bit scan chain architecture may be implemented and/or incorporated in various types of embedded systems for automotive, electronic, mobile, server and Internet-of-things (IoT) applications, including remote sensor nodes.

As shown in FIG. 1, the multi-bit scan chain architecture 104 may refer to a logic based structure having mux-clock generator circuitry 108, scan chain circuitry 114 and error-bit generator circuitry 118. The scan chain circuitry 114 may be configured to receive a multi-bit input (D0, D1, D2, . . . , DN), provide a multi-bit output (Q0, Q1, Q2, . . . , QN), and provide a multi-bit multiplexer output (MuxOut) based on the multi-bit input (D0, D1, D2, . . . , DN) and the multi-bit output (Q0, Q1, Q2, . . . , QN). Also, the error-bit generator circuit 118 may be configured to receive the multi-bit multiplexer output (MuxOut), receive a portion of the multi-bit input (e.g., D0), receive a portion of the multi-bit output (e.g., QN), and then provide an error-bit output (ERB) based on the multi-bit multiplexer output (MuxOut), the portion of the multi-bit input (e.g., D0), and the portion of the multi-bit output (e.g., QN). As such, in some instances, the multi-bit scan chain architecture 104 may refer to an N-bit scan chain that is configured to receive a number (N) of multi-bit data inputs (D0, D1, D2, . . . , DN) and provide a number (N) of multi-bit data outputs (Q0, Q1, Q2, . . . , QN). Also, the multi-bit multiplexer output (MuxOut) may refer to an (N−1) bit mux-output signal.

In some implementations, the mux-clock generator circuitry 108 may be configured to receive an external clock signal (CK), receive a scan enable input (SE), and then provide a mux-clock signal (MCK). Also, in some instances, the scan chain circuitry 114 may receive the mux-clock signal (MCK) and then provide the multi-bit multiplexer output (MuxOut) based on the multi-bit input (D0, D1, D2, . . . , DN), the multi-bit output (Q0, Q1, Q2, . . . , QN) and the mux-clock signal (MCK). Also, in some instances, the mux-clock generator circuitry 108 may include one or more logic components, such as, e.g., a logic gate (L0) that may refer to use of an OR gate, or similar. However, in other instances, other logic gates and/or devices may be used to provide similar logical behaviors and/or results. Also, the scan enable input (SE) may refer to a logic zero (log 0) signal, such as, e.g., a ground voltage (VSS). Also, the logic gate (L0) may receive the external clock signal (CK) and the scan enable input (SE) as inputs and then provide the mux-clock signal (MCK) as output.

In various implementations, the scan chain circuitry 114 may receive a scan input signal (SI) and the external clock signal (CK). The scan chain circuitry 114 may also provide the multi-bit multiplexer output (MuxOut) and the multi-bit output (Q0, Q1, Q2, . . . , QN) based on the scan input signal (SI), the multi-bit input (D0, D1, D2, . . . , DN), the multi-bit output (Q0, Q1, Q2, ..., QN), the mux-clock signal (MCK) and the external clock signal (CK). Also, in some instances, the scan input signal (SI) may refer to a logic zero (log 0) signal, such as, e.g., a ground voltage (VSS or GND).

In various implementations, the multi-bit input (D0, D1, D2, ..., DN) may refer to a first number of data-bits, the multi-bit output (Q0, Q1, Q2, ..., QN) may refer to a second number of data-bits similar to the first number of data-bits, and the multi-bit multiplexer output (MuxOut) may refer to a third number of data-bits that is less than the first number of data-bits. Also, in some instances, the error-bit (ERB) may refer to a single error-bit. Further, in some instances, the portion of the multi-bit input (D0, D1, D2, ..., DN) may refer to a first single data-bit (e.g., D0) from the first number of data-bits, and the portion of the multi-bit output (Q0, Q1, Q2, ..., QN) may refer to a second single data-bit (e.g., QN) from the second number of data-bits.

In some implementations, the scan chain circuitry 114 may have multiplexers and latches, e.g., as shown in FIGS. 2-3. In some instances, the multiplexers may be configured to receive the multi-bit input (D0, D1, D2, ..., DN) and provide the multi-bit multiplexer output (MuxOut), and also, the latches may be configured to receive the multi-bit multiplexer output (MuxOut) and provide the multi-bit output (Q0, Q1, Q2, ..., QN). Also, in some instances, the multiplexers may be configured to receive the mux-clock signal (MCK) and provide the multi-bit multiplexer output (MuxOut) based on the multi-bit input (D0, D1, D2, ..., DN), the multi-bit output (Q0, Q1, Q2, ..., QN), and the mux-clock signal (MCK). In some instances, the latches may be configured to receive the external clock signal (CK), receive the multi-bit multiplexer output (MuxOut) and provide the multi-bit output (Q0, Q1, Q2, ..., QN) based on the external clock signal (CK) and the multi-bit multiplexer output (MuxOut).

In some implementations, the error-bit generator circuitry 118 may have logic that may include input logic configured to receive the multi-bit multiplexer output (MuxOut) and provide a first internal signal. Also, the logic may include intermediate logic that is configured to receive the first internal signal, receive the portion of the multi-bit input (e.g., DO), and then provide a second internal signal. Also, the error-bit generator circuitry 118 may have latches that may include a latch configured to receive the external clock signal (CK), receive the first internal signal, and then provide a first latched signal. Also, the latches may include a flip-flop configured to receive the external clock signal (CK), receive the second internal signal, and then provide a second latched signal. Also, the logic may include output logic configured to receive the first latched signal, receive the second latched signal, receive the portion of the multi-bit output (e.g., QN), and provide the error-bit output (ERB).

As shown in FIG. 2, the multi-bit scan chain architecture 204 may refer to similar multi-bit scan chain architecture 104 of FIG. 1 that may be implemented with a similar logic structure having scan chain circuitry 214 and error-bit generator circuitry 218. Also, the multi-bit scan chain architecture 204 may have the mux-clock generator circuitry 108 that provides the mux-clock signal (MCK). As described herein, the mux-clock generator circuitry 108 may be configured to generate the mux-clock signal (MCK) based on an external clock signal (CK) and scan enable signal (SE). Also, the scan chain circuitry 214 may be configured to receive the multi-bit input (D0, D1, D2, ..., DN), generate the multi-bit output (Q0, Q1, Q2, ..., QN), and generate the multi-bit multiplexer output (MuxOut) based on the mux-clock signal (MCK), the external clock signal (CK), the multi-bit input (D0, D1, D2, ..., DN) and the multi-bit output (Q0, Q1, Q2, ..., QN). Also, the error-bit generator 218 may be configured to receive the external clock signal (CK), receive the multi-bit multiplexer output (MuxOut), receive a portion of the multi-bit input (D0, D1, D2, ..., DN), receives a portion of the multi-bit output (Q0, Q1, Q2, ..., QN) and generate the error-bit output (ERB) based on the external clock signal (CK), the multi-bit multiplexer output (MuxOut), the portion of the multi-bit input (D0, D1, D2, ..., DN), and the portion of the multi-bit output (Q0, Q1, Q2, ..., QN).

In some implementations, the scan chain circuitry 214 may receive the scan input signal (SI), and the scan chain circuitry 214 may then generate the multi-bit multiplexer output (MuxOut) and the multi-bit output (Q0, Q1, Q2, ..., QN) based on the scan input signal (SI), the multi-bit input (D0, D1, D2, ..., DN), the multi-bit output (Q0, Q1, Q2, ..., QN), the mux-clock signal (MCK) and the external clock signal (CK). As described herein, the scan enable signal (SE) may refer to a logic zero signal (log 0) or ground (GND), and the scan input signal (SI) may refer to a logic zero signal (log 0) or ground (GND).

In some implementations, the multi-bit input (D0, D1, D2, ..., DN) may refer to a first number of data-bits, and the multi-bit output (Q0, Q1, Q2, ..., QN) may refer to a second number of data-bits similar to the first number of data-bits. Further, the multi-bit multiplexer output (MuxOut) may refer to a third number of data-bits that is less than the first number of data-bits, and also, the error-bit (ERB) may refer to a single error-bit. In some instances, the portion of the multi-bit input (D0, D1, D2, ..., DN) may refer to a first single data-bit from the first number of data-bits, and also, the portion of the multi-bit output (Q0, Q1, Q2, ..., QN) may refer to a second single data-bit from the second number of data-bits.

In various implementations, as shown in FIG. 2, the scan chain circuitry 214 may include a number of multiplexers (e.g., M0, M1, M2, M3) and a number of latches (e.g., FF0, FF1, FF2, FF3). For instance, the number of multiplexers may be 4, and in this instance, the multiplexers (M0, M1, M2, M3) may be configured to receive the multi-bit input (D0, D1, D2, ..., DN) and provide the multi-bit multiplexer output (MuxOut). Also, the number of latches may be 4, and in this instance, the latches (e.g., FF0, FF1, FF2, FF3) may be configured to receive the multi-bit multiplexer output (MuxOut) and provide the multi-bit output (Q0, Q1, Q2, ..., QN). In various instances, the multiplexers (M0, M1, M2, M3) may refer to 2-input and single-output (i.e., 2:1) multiplexers, and the latches (FF0, FF1, FF2, FF3) may refer to flip-flops (i.e., FF), such as, e.g., D-flip flops (DFF). Also, the multiplexers (M0, M1, M2, M3) may be configured to receive the mux-clock signal (MCK) and provide the multi-bit multiplexer output (MuxOut) based on the multi-bit input (D0, D1, D2, ..., DN), the multi-bit output (Q0, Q1, Q2, ..., QN), and the mux-clock signal (MCK). Also, the latches (FF0, FF1, FF2, FF3) may be configured to receive the external clock signal (CK), receive the multi-bit multiplexer output (MuxOut) and provide the multi-bit output (Q0, Q1, Q2, ..., QN) based on the external clock signal (CK) and the multi-bit multiplexer output (MuxOut).

In some implementations, as shown in FIG. 2, the error-bit generator circuitry 218 may have logic, such as, e.g., input logic, intermediate logic and output logic. In some instances, the input logic (L1) may be configured to receive the multi-bit multiplexer output (MuxOut) and provide a first internal signal (INT1). Also, the intermediate logic (L2) may be configured to receive the first internal signal (INT1), receive the portion of the multi-bit input (e.g., DO), and provide a second internal signal (INT2). The error-bit generator circuitry 218 may also have other logic such as, e.g., latches (L3, L4). In some instances, the latches may include a first latch (L3) that is configured to receive the external clock signal (CK), receive the first internal signal (INT1), and provide a first latched signal (LS1). Also, the latches may include a second latch or flip-flop (L4) that is configured to receive the external clock signal (CK), receive the second internal signal (INT2), and provide a second latched signal (LS2). Also, the output logic (L5) may be configured to receive the first latched signal (LS1), receive the second latched signal (LS2), receive the portion of the multi-bit output (e.g., Q3), and then provide the error-bit output (ERB).

In some implementations, the scan chain circuitry 214 may refer to an N-bit scan chain, such as, e.g., a 4-bit scan chain, wherein the number of data bits is 4. Thus, in some instances, the N-bit scan chain may be configured to receive a number (e.g., N=4) of multi-bit data inputs (D0, D1, D2, ..., DN) and provide a number (e.g., N=4) of multi-bit data outputs (Q0, Q1, Q2, ..., QN). Also, the multi-bit multiplexer output (MuxOut) may refer to an (N–1) bit mux-output signal, such as, e.g., (4-1)=3 bit MuxOut signal. In this instance, logic L1 may refer to a 3-input XOR gate, logic L2 may refer to a 2-input XOR gate, and logic L5 may refer to a 3-input XOR gate. However, various other logic structure implementations may be used to provide similar features, characteristics, behaviors and/or logical results.

As shown in FIG. 3, the multi-bit scan chain architecture 304 may refer to similar multi-bit scan chain architectures 104, 204 as shown in FIGS. 1-2, respectively, that may be implemented with similar logic structures having scan chain circuitry 314 along with error-bit generator circuitry 318. Also, the multi-bit scan chain architecture 304 may have the mux-clock generator circuitry 108 that provides the mux-clock signal (MCK). As described herein, the mux-clock generator circuitry 108 is configured to generate the mux-clock signal (MCK) based on the external clock signal (CK) and scan enable signal (SE). Also, the scan chain circuitry 314 may be configured to receive the multi-bit input (D0, D1, ..., DN), generate the multi-bit output (Q0, Q1, ..., QN), and then generate the multi-bit multiplexer output (MuxOut) based on the mux-clock signal (MCK), the external clock signal (CK), the multi-bit input (D0, D1, ..., DN) and the multi-bit output (Q0, Q1, ..., QN). Also, the error-bit generator 318 may be configured to receive the external clock signal (CK), receive the multi-bit multiplexer output (MuxOut), receive a portion of the multi-bit input (D0, D1, ..., DN), receives a portion of the multi-bit output (Q0, Q1, ..., QN) and then generate the error-bit output (ERB) based on the external clock signal (CK), the multi-bit multiplexer output (MuxOut), the portion of the multi-bit input (D0, D1, ..., DN), and the portion of the multi-bit output (Q0, Q1, ..., QN).

In some implementations, the scan chain circuitry 314 may receive the scan input signal (SI), and the scan chain circuitry 314 may then generate the multi-bit multiplexer output (MuxOut) and the multi-bit output (Q0, Q1, ..., QN) based on the scan input signal (SI), the multi-bit input (D0, D1, ..., DN), the multi-bit output (Q0, Q1, ..., QN), the mux-clock signal (MCK) and the external clock signal (CK). As described herein, the scan enable signal (SE) may refer to a logic zero signal (log 0) or ground (GND), and the scan input signal (SI) may refer to a logic zero signal (log 0) or ground (GND).

In some implementations, the multi-bit input (D0, D1, ..., DN) may refer to a first number of data-bits, and the multi-bit output (Q0, Q1, ..., QN) may refer to a second number of data-bits similar to the first number of data-bits. Further, the multi-bit multiplexer output (MuxOut) may refer to a third number of data-bits that is less than the first number of data-bits, and also, the error-bit (ERB) may refer to a single error-bit. In some instances, the portion of the multi-bit input (D0, D1, ..., DN) may refer to a first single data-bit from the first number of data-bits, and also, the portion of the multi-bit output (Q0, Q1, ..., QN) may refer to a second single data-bit from the second number of data-bits.

In various implementations, as shown in FIG. 3, the scan chain circuitry 314 may have a number (N) of multiplexers (M0, M1, ..., MN) and a number (N) of latches (FF0, FF1, ..., FFN). As such, the number of multiplexers may be any number, and in this instance, the multiplexers (M0, M1, ..., MN) may be configured to receive the multi-bit input (D0, D1, ..., DN) and provide the multi-bit multiplexer output (MuxOut). Also, the number of latches may be any number, and in this instance, the latches (FF0, FF1, ..., FFN) may be configured to receive the multi-bit multiplexer output (MuxOut) and provide the multi-bit output (Q0, Q1, ..., QN). In various instances, the multiplexers (M0, M1, ..., MN) may refer to 2-input/single-output (i.e., 2:1) multiplexers, and the latches (FF0, FF1, ..., FFN) may refer to flip-flops (i.e., FF), such as, e.g., D-flip flops (DFF). The multiplexers (M0, M1, ..., MN) may be configured to receive the mux-clock signal (MCK) and provide the multi-bit multiplexer output (MuxOut) based on the multi-bit input (D0, D1, ..., DN), the multi-bit output (Q0, Q1, ..., QN), and the mux-clock signal (MCK). Also, the latches (FF0, FF1, ..., FFN) may be configured to receive the external clock signal (CK), receive the multi-bit multiplexer output (MuxOut) and provide the multi-bit output (Q0, Q1, ..., QN) based on the external clock signal (CK) and the multi-bit multiplexer output (MuxOut).

In some implementations, as shown in FIG. 3, the error-bit generator circuitry 318 may have logic, such as, e.g., input logic, intermediate logic and output logic. In some instances, the input logic (L1) may be configured to receive the multi-bit multiplexer output (MuxOut) and provide a first internal signal (INT1). Also, the intermediate logic (L2) may be configured to receive the first internal signal (INT1), receive the portion of the multi-bit input (e.g., DO), and provide a second internal signal (INT2). The error-bit generator circuitry 318 may also have other logic such as, e.g., latches (L3, L4). In some instances, the latches may include a first latch (L3) that is configured to receive the external clock signal (CK), receive the first internal signal (INT1), and provide a first latched signal (LS1). Also, the latches may include a second latch or flip-flop (L4) that is configured to receive the external clock signal (CK), receive the second internal signal (INT2), and provide a second latched signal (LS2). Also, the output logic (L5) may be configured to receive the first latched signal (LS1), receive the second latched signal (LS2), receive the portion of the multi-bit output (e.g., Q3), and then provide the error-bit output (ERB).

In some implementations, the scan chain circuitry 314 may refer to an N-bit scan chain, wherein the number of data bits may refer to any number. As such, in some instances, the N-bit scan chain may be configured to receive a number (N) of multi-bit data inputs (D0, D1, ..., DN) and provide a number (N) of multi-bit data outputs (Q0, Q1, ..., QN). Also, the multi-bit multiplexer output (MuxOut) may refer to an (N−1) bit mux-output signal, and in this instance, logic L1 may refer to an N-bit-input XOR gate, logic L2 may refer to a 2-input XOR gate, and logic L5 may refer to a 3-input XOR gate. However, in various implementations, various other logic structures may be used so as to provide similar features, characteristics, behaviors and/or logical results.

Figure 4:
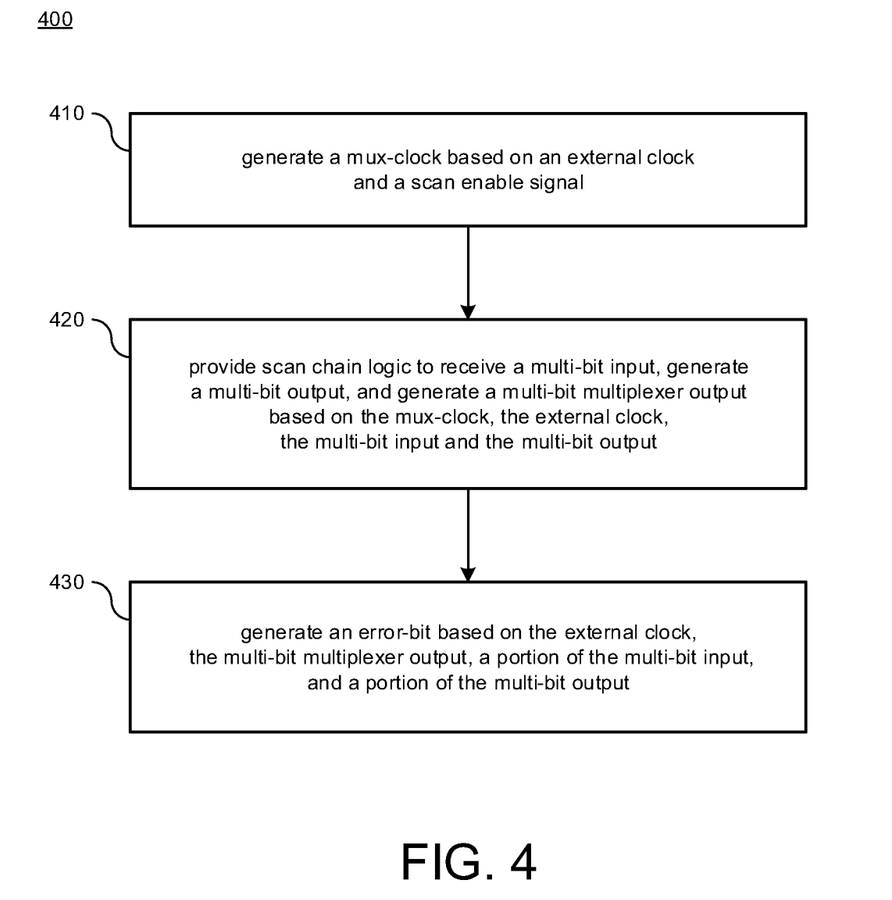
FIG. 4 illustrates a process diagram of a method for providing multi-bit scan chain architecture in accordance with various implementations described herein.

FIG. 4 illustrates a process diagram of a method 400 for providing multi-bit scan chain architecture in accordance with various implementations described herein. In addition, as described herein, method 400 may be used to provide multi-bit scan chain architecture with error-bit generation circuitry and mux-clock generation circuitry.

It should be understood that even though method 400 indicates a particular order of operation execution, in some cases, various portions of operations may be executed in a different order, and on different systems. In other cases, additional operations and/or steps may be added to and/or omitted from method 400. Also, method 400 may be implemented in hardware and/or software. For instance, if implemented in hardware, method 400 may be implemented with various components and/or circuitry, as described in FIGS. 1-3. Also, in other instances, if implemented in software, method 400 may be implemented as a program or software instruction process configured for providing multi-bit scan chain architecture with an error-bit generator and a mux-clock generator, as described herein. Also, if implemented in software, instructions related to implementing method 400 may be stored in memory and/or a database. Also, in some implementations, a computer or various other types of computing devices with a processor and memory may be configured to perform method 400.

As described in reference to FIG. 4, the method 400 may be used for fabricating and/or manufacturing, or causing to be fabricated and/or manufactured, an integrated circuit (IC) that implements various schemes and techniques in physical design as described herein so as to thereby provide multi-bit scan chain architecture with error-bit generation and mux-clock generation using various devices, components and/or circuitry as described herein.

At block 410, method 400 may generate a mux-clock based on an external clock and a scan enable signal. At block 420, method 400 may provide scan chain logic to receive a multi-bit input, generate a multi-bit output, and generate a multi-bit multiplexer output based on the mux-clock, the external clock, the multi-bit input and the multi-bit output. At block 430, method 400 may generate an error-bit based on the external clock, the multi-bit multiplexer output, a portion of the multi-bit input, and a portion of the multi-bit output.

In some implementations, the scan chain may have multiplexers and latches, and the multiplexers may be configured to receive the multi-bit input and then provide the multi-bit multiplexer output. Also, the latches may be configured to receive the multi-bit multiplexer output and provide the multi-bit output. In some instances, the multiplexers may receive the mux-clock and provide the multi-bit multiplexer output based on the multi-bit input, the multi-bit output, and the mux-clock. Also, the latches may receive the external clock, receive the multi-bit multiplexer output and provide the multi-bit output based on the external clock and the multi-bit multiplexer output.

In some implementations, generating the error-bit refers to generating the error-bit with error-bit generator logic that receives the external clock, receives the multi-bit multiplexer output, receives a portion of the multi-bit input, receives a portion of the multi-bit output, and then generates the error-bit based on the external clock, the multi-bit multiplexer output, the portion of the multi-bit input, and the portion of the multi-bit output. Also, in some instances, the error-bit generator logic may have input logic that receives the multi-bit multiplexer output and provides a first internal signal. The error-bit generator logic may have intermediate logic that receives the first internal signal, receives the portion of the multi-bit input, and provides a second internal signal. The error-bit generator logic may have latch logic that receives the external clock, receives the first internal signal, and provides a first latched signal. Also, the error-bit generator logic may have flip-flop logic that receives the external clock, receives the second internal signal, and provides a second latched signal. Also, the error-bit generator logic may have output logic that receives the first latched signal, receives the second latched signal, receives the portion of the multi-bit output, and provides the error-bit output.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

Described herein are various implementations of a device having a scan chain that receives a multi-bit input, provides a multi-bit output, and also provides a multi-bit multiplexer output based on the multi-bit input and the multi-bit output. The device may have an error-bit generator that receives the multi-bit multiplexer output, receives a portion of the multi-bit input, receives a portion of the multi-bit output, and provides an error-bit output based on the multi-bit multiplexer output, the portion of the multi-bit input, and the portion of the multi-bit output.

Described herein are various implementations of a device having a mux-clock generator that generates a mux-clock signal based on an external clock signal and a scan enable signal. The device may have a scan chain that receives a multi-bit input, generates a multi-bit output, and generates a multi-bit multiplexer output based on the mux-clock signal, the external clock signal, the multi-bit input and the multi-bit output. The device may have an error-bit generator that receives the external clock signal, receives the multi-bit multiplexer output, receives a portion of the multi-bit input, receives a portion of the multi-bit output, and generates an error-bit output based on the external clock signal, the multi-bit multiplexer output, the portion of the multi-bit input, and the portion of the multi-bit output.

Described herein are various implementations of a method. The method may generate a mux-clock based on an external clock and a scan enable signal. The method may provide scan chain logic to receive a multi-bit input, generate a multi-bit output, and generate a multi-bit multiplexer output based on the mux-clock, the external clock, the multi-bit input and the multi-bit output. The method may generate an error-bit based on the external clock, the multi-bit multiplexer output, a portion of the multi-bit input, and a portion of the multi-bit output.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
a scan chain that receives a multi-bit input, provides a multi-bit output, and provides a multi-bit multiplexer output based on the multi-bit input and the multi-bit output; and
an error-bit generator that receives the multi-bit multiplexer output, receives a portion of the multi-bit input, receives a portion of the multi-bit output, and provides an error-bit output based on the multi-bit multiplexer output, the portion of the multi-bit input, and the portion of the multi-bit output.

2. The device of claim 1, further comprising:
a mux-clock generator that receives an external clock signal, receives a scan enable input, and provides a mux-clock signal,
wherein the scan chain receives the mux-clock signal and then provides the multi-bit multiplexer output based on the multi-bit input, the multi-bit output and the mux-clock signal.

3. The device of claim 2, wherein:
the scan chain receives a scan input signal and an external clock signal, and
the scan chain provides the multi-bit multiplexer output and the multi-bit output based on the scan input signal, the multi-bit input, the multi-bit output, the mux-clock signal and the external clock signal.

4. The device of claim 3, wherein:
the scan enable signal refers to logic zero signal or ground, and
the scan input signal refers to logic zero signal or ground.

5. The device of claim 1, wherein:
the multi-bit input refers to a first number of data-bits,
the multi-bit output refers to a second number of data-bits similar to the first number of data-bits,
the multi-bit multiplexer output refers to a third number of data-bits that is less than the first number of data-bits, and
the error-bit refers to a single error-bit.

6. The device of claim 5, wherein:
the portion of the multi-bit input refers to a first single data-bit from the first number of data-bits, and
the portion of the multi-bit output refers to a second single data-bit from the second number of data-bits.

7. The device of claim 1, wherein:
the scan chain has multiplexers and latches,
the multiplexers are configured to receive the multi-bit input and provide the multi-bit multiplexer output, and
the latches are configured to receive the multi-bit multiplexer output and provide the multi-bit output.

8. The device of claim 7, wherein:
the multiplexers are configured to receive a mux-clock signal and provide the multi-bit multiplexer output based on the multi-bit input, the multi-bit output, and the mux-clock signal, and
the latches are configured to receive an external clock signal, receive the multi-bit multiplexer output and provide the multi-bit output based on the external clock signal and the multi-bit multiplexer output.

9. The device of claim 1, wherein:
the error-bit generator has logic,
the logic includes input logic configured to receive the multi-bit multiplexer output and provide a first internal signal, and
the logic includes intermediate logic configured to receive the first internal signal, receive the portion of the multi-bit input, and provide a second internal signal.

10. The device of claim 9, wherein:

the error-bit generator has latches, the latches include a latch configured to receive an external clock signal, receive the first internal signal, and provide a first latched signal, the latches include a flip-flop configured to receive the external clock signal, receive the second internal signal, and provide a second latched signal, and the logic includes output logic configured to receive the first latched signal, receive the second latched signal, receive the first multi-bit output of the portion of the multi-bit output, and provide the error-bit output.

11. A device comprising:

a mux-clock generator that generates a mux-clock signal based on an external clock signal and a scan enable signal;

a scan chain that receives a multi-bit input, generates a multi-bit output, and generates a multi-bit multiplexer output based on the mux-clock signal, the external clock signal, the multi-bit input and the multi-bit output; and an error-bit generator that receives the external clock signal, receives the multi-bit multiplexer output, receives a portion of the multi-bit input, receives a portion of the multi-bit output, and generates an error-bit output based on the external clock signal, the multi-bit multiplexer output, the portion of the multi-bit input, and the portion of the multi-bit output.

12. The device of claim 11, wherein:

the scan chain receives a scan input signal, and the scan chain generates the multi-bit multiplexer output and the multi-bit output based on the scan input signal, the multi-bit input, the multi-bit output, the mux-clock signal and the external clock signal.

13. The device of claim 12, wherein:

the scan enable signal refers to logic zero signal or ground, and the scan input signal refers to logic zero signal or ground.

14. The device of claim 11, wherein:

the multi-bit input refers to a first number of data-bits, the multi-bit output refers to a second number of data-bits similar to the first number of data-bits, the multi-bit multiplexer output refers to a third number of data-bits that is less than the first number of data-bits, and the error-bit refers to a single error-bit.

15. The device of claim 14, wherein:

the portion of the multi-bit input refers to a first single data-bit from the first number of data-bits, and the portion of the multi-bit output refers to a second single data-bit from the second number of data-bits.

16. A method comprising:

generating a mux-clock based on an external clock and a scan enable signal;

providing scan chain logic to receive a multi-bit input, generate a multi-bit output, and generate a multi-bit multiplexer output based on the mux-clock, the external clock, the multi-bit input and the multi-bit output; and generating an error-bit based on the external clock, the multi-bit multiplexer output, a portion of the multi-bit input, and a portion of the multi-bit output.

17. The method of claim 16, wherein:

the scan chain logic has multiplexers and latches, the multiplexers are configured to receive the multi-bit input and provide the multi-bit multiplexer output, and the latches are configured to receive the multi-bit multiplexer output and provide the multi-bit output.

18. The method of claim 17, wherein:

the multiplexers receive the mux-clock and provide the multi-bit multiplexer output based on the multi-bit input, the multi-bit output, and the mux-clock, and the latches receive the external clock, receive the multi-bit multiplexer output and provide the multi-bit output based on the external clock and the multi-bit multiplexer output.

19. The method of claim 16, wherein:

generating the error-bit refers to generating the error-bit with error-bit generator logic that receives the external clock, receives the multi-bit multiplexer output, receives a portion of the multi-bit input, receives a portion of the multi-bit output, and generates the error-bit based on the external clock, the multi-bit multiplexer output, the portion of the multi-bit input, and the portion of the multi-bit output.

20. The method of claim 19, wherein:

the error-bit generator logic has input logic that receives the multi-bit multiplexer output and provides a first internal signal, the error-bit generator logic has intermediate logic that receives the first internal signal, receives the portion of the multi-bit input, and provides a second internal signal, the error-bit generator logic has latch logic that receives the external clock, receives the first internal signal, and provides a first latched signal, the error-bit generator logic has flip-flop logic that receives the external clock, receives the second internal signal, and provides a second latched signal, and the error-bit generator logic has output logic that receives the first latched signal, receives the second latched signal, receives the portion of the multi-bit output, and provides the error-bit output.

* * * * *